United States Patent
Vijayrao et al.

(10) Patent No.: US 6,615,229 B1
(45) Date of Patent: Sep. 2, 2003

(54) DUAL THRESHOLD VOLTAGE COMPLEMENTARY PASS-TRANSISTOR LOGIC IMPLEMENTATION OF A LOW-POWER, PARTITIONED MULTIPLIER

(75) Inventors: Narsing Vijayrao, Santa Clara, CA (US); Chi Keung Lee, San Jose, CA (US); Kumar Sudarshan, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 546 days.

(21) Appl. No.: 09/605,543

(22) Filed: Jun. 29, 2000

(51) Int. Cl.⁷ .................................. G06F 7/52
(52) U.S. Cl. ................................... 708/629
(58) Field of Search ............................ 708/629

(56) References Cited

U.S. PATENT DOCUMENTS

| | | | | |
|---|---|---|---|---|
| 5,504,915 A | * | 4/1996 | Rarick | 708/708 |
| 5,787,029 A | * | 7/1998 | de Angel | 708/628 |
| 6,012,079 A | * | 1/2000 | Song | 708/714 |
| 6,442,582 B1 | * | 8/2002 | Hale | 708/629 |
| 2001/0009012 A1 | * | 7/2001 | Itoh | 708/629 |

* cited by examiner

Primary Examiner—David H. Malzahn
(74) Attorney, Agent, or Firm—Kenyon & Kenyon

(57) ABSTRACT

The present invention relates to a new low-power, high performance multiplier circuit design, and more specifically to a partitioned multiplier implemented using a modified, symmetrical Wallace tree structure that enables the power to parts of the multiplier to be selectively turned on and off. A multiplier implemented using complementary pass-transistor logic (CPL) 3:2 carry save adders (CSAs) includes a left array with a first multiple of CPL CSAs, a right array with a second multiple of CPL CSAs, and a merge block coupled to the left array and the right array, such that the left and right arrays are not coupled to each other. The left and right arrays are configured to independently receive power, such that, each array can be turned on and off without affecting the other array. The merge block includes a third multiple of CPL CSAs and the merge block can be configured to output a result value of a multiplication operation.

27 Claims, 5 Drawing Sheets

DUAL THRESHOLD VOLTAGE COMPLEMENTARY PASS-TRANSISTOR LOGIC IMPLEMENTATION OF A LOW-POWER, PARTITIONED MULTIPLIER

FIELD OF THE INVENTION

The present invention relates to computer multiplication in general and more specifically to a new low-power, partitioned multiplier implemented using a modified, symmetrical Wallace tree structure that enables the power to parts of the multiplier to be selectively turned on and off.

BACKGROUND

Processing in multimedia applications, such as, for example, applications using the International Organization for Standardization (ISO) Moving Picture Experts Group (MPEG-1) system, video and audio standard, ISO CD 11172, published June 1996, and digital signal processing require the performance of numerous multiplication operations. In fact, it has been estimated that almost 9% of all instructions in typical scientific programs are multiplication operations. As a result, high speed multipliers have become critical for the efficient performance of microprocessors.

In high performance microprocessors, the multiplier is the core functional unit that performs these multiplication computations. In general, the multiplier is a high-power consuming portion of the chip and, in recent design projects, a multiplier in a floating point unit (FPU) became the hottest spot. Because multipliers are very dense structures and have a lot of activity in their circuits, that is, a high toggling rate, multipliers generally lead to a large amount of power being dissipated within a small area, which can lead to hot spots. To achieve he desired reliability requirements of current microprocessors, designers have to balance the trade-offs between power and performance. Therefore, having a high performance and low power multiplier is increasingly important.

In general, when making tradeoffs, designers consider two main aspects, 1) which type of circuits to use, and 2) which architecture to use. On the circuit side, Domino circuits have traditionally been the preferred choice for multiplier implementation, because the Domino circuit design provides excellent performance in terms of speed. However, Domino circuits are a high-power circuit style. As microprocessors move toward designs with operating speeds in the multi-GHz range, power quickly becomes the dominating factor in choosing the design style for the microprocessor. The Domino circuit's high consumption of power is due to the need for a clock signal, which also leads to difficulty in clock skew management. Moreover, the Domino circuit design is very noise sensitive.

On the architecture side, the popular choices for multiplier design are in the form of linear tree, array and Wallace tree structures. In many current microprocessor designs, linear tree structures have been used because of the ease of layout and pipelining. However, studies have shown that the use of the Wallace tree structure leads to shorter pipelines, which results in lower latency and higher performance. Current designers have shown innovative methods of laying out Wallace tree structures in a regular fashion and, in fact, Wallace tree is used in the Intel® Pentium® brand processors. Intel® Pentium® processors are manufactured by the Intel Corporation of Santa Clara, Calif.

FIG. 1 is a logic block diagram illustrating a known 3:2 Carry Save Adder (CSA), Wallace tree structure implementation of a Radix-4 multiplier. In general, multipliers use an array of CSAs to compute the product of 2 numbers using a 'ripple-free' carry scheme to sum the partial products. These CSAs can be implemented using any logic circuit, such as, for example, a Domino circuit or a static circuit. In each 3:2 CSA, 3 partial products are input and 2 partial products are output, that is, a sum partial product and a carry partial product are output. In general, the logic equations of a 3:2 CSA are:

Carry=a*b+b*c+c*a, where a, b and c are the three partial product inputs,

Sum=a⊕b⊕c, where ⊕stands for 'exclusive OR' (XOR).

In FIG. 1, the multiplier includes 32 CSAs, CSA 0–CSA 31, which are organized in an eight-level, asymmetrical Wallace tree structure architecture. The first level, which includes CSA 0 through CSA 10, receives 33 64-bit partial product inputs to be added. The output partial products from each of the CSAs includes the carry value and the sum value obtained from adding the 3 input partial products. An adder output 10 is shown being input to CSA 28, where the adder output 110 is used as a value, such as, for example, z to enable the performance of operations, such as, x*y+z, where x and y represent the initial input values being multiplied together and which were used to generate the partial product inputs to the multiplier. Unfortunately, the multiplier design in FIG. 1 has a high operational power requirement, especially when implemented using Domino circuits, and is configured such that all of the CSAs must operate, even when the input partial products fill the left most CSAs only with "0's" and, thus, the output partial products from these CSAs do not contribute any results that will affect the final output.

Therefore, what is needed is a new circuit implementation and architecture that provides a low-power yet high-performance multiplier that is simple to implement for use in high performance processors, such as, for example, digital signal processors and microprocessors central processing units (CPUs), graphics processors, and co-processors.

DETAILED DESCRIPTION

Figure 1:
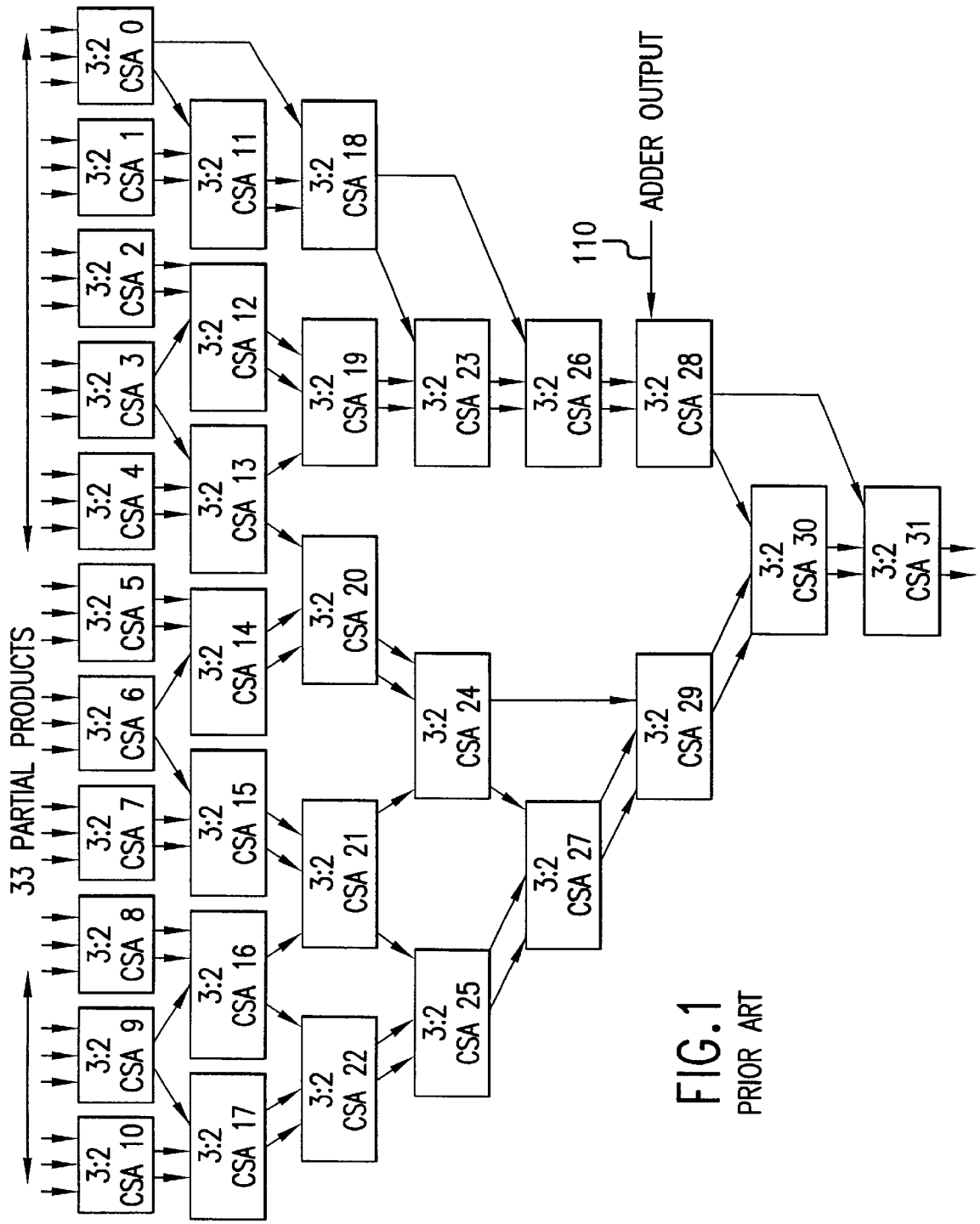
FIG. 1 is a logic block diagram illustrating a known 3:2 Carry Save Adder (CSA), Wallace tree structure implementation of a Radix-4 multiplier.

In accordance with an embodiment of the present invention, multiple Complementary Pass-transistor Logic (CPL) 3:2 Carry Save Adders (CSAs) are coupled together in a modified, symmetrical Wallace tree architecture to provide a low-power multiplier design that provides the same performance as a counterpart high-power Domino circuit implementation of the design in FIG. 1. In this embodiment, power savings of up to 50% are achievable and with even more aggressive sizing a 75% power savings is achievable. These power reductions are achieved without a loss in performance and are made possible by using an advanced, low voltage (Vt) process technology, Dual Threshold Voltage (dual Vt) Devices, in the CSAs. These low Vt devices may be used in a tree structure of both a Carry cell and a Sum cell in the CSAs and the low Vt devices have a lower threshold voltage than the normal Vt devices, thus, increasing the speed of the circuit. High Vt devices, such as, for example, an inverter, are used in the output stage of each CSA to improve the integrity of the signal.

Figure 2:
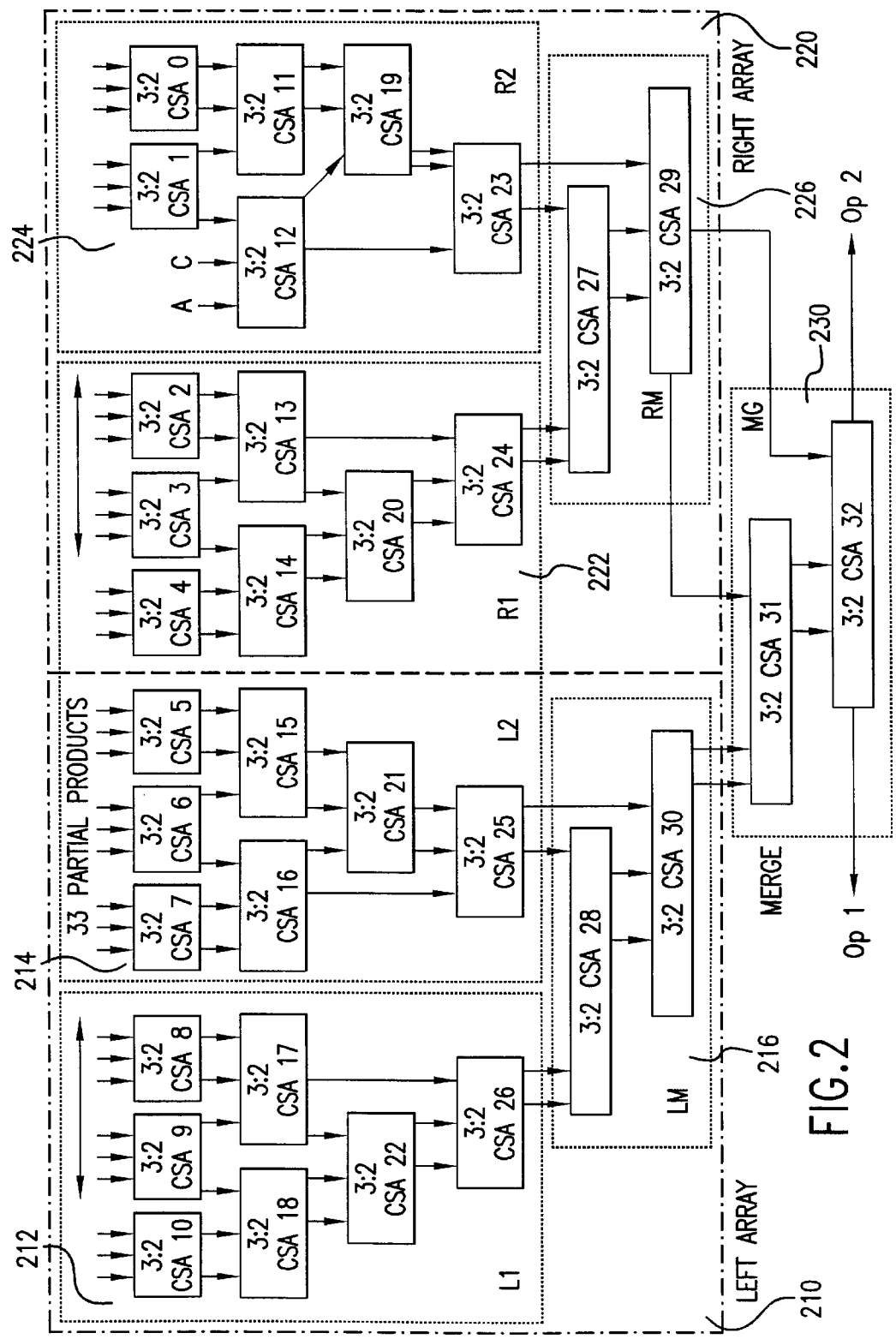
FIG. 2 is a logic block diagram illustrating a modified Wallace tree structure showing a symmetrical organization of the parts of the multiplier in accordance with an embodiment of the present invention.

In accordance with an embodiment of the present invention, the elements used include: a plurality of 3:2 CPL CSAs, which are implemented using dual Vt devices and are coupled in a modified, symmetrical Wallace tree structure. FIG. 2 is a logic block diagram illustrating a modified Wallace tree structure showing a symmetrical organization of the parts of the multiplier in accordance with an embodiment of the present invention. In FIG. 2, an eight-level, modified, symmetrical Wallace tree architecture multiplier is illustrated, which provides the same functionality and performance as the multiplier illustrated in FIG. 1. However, in an embodiment of the present invention, the multiplier in FIG. 2 can require up to 50%, or more, less power to operate and can be implemented in less area than the multiplier illustrated in FIG. 1. In an embodiment of the present invention, the multiplier in FIG. 2 is a 64-bit multiplier with a radix-4 modified Booth encoding scheme that generates 33 partial products and has 8 CSAs in the critical path of the symmetrical Wallace tree structure. A detailed implementation of the algorithm used for the Booth encoding of the partial products is described in U.K. patent Application GB 2,262,638A, published Jun. 23, 1993, particularly in FIGS. 9–12. In general, the 8 CSAs in the critical path of the symmetrical Wallace tree provide a shorter latency than the linear tree implementation. Even with a slightly complicated layout requirement, the Wallace tree structure provides superior performance.

In accordance with an embodiment of the present invention, in FIG. 2, 33 CSAs, CSA 0–CSA 32, are coupled together to form the multiplier and 11 CSAs are laid out on a first level to receive the 33 partial product inputs of the two values to be multiplied together. This is 1 CSA more than the 32 CSAs used to implement the known multiplier in FIG. 1. In an embodiment of the present invention, these partial product inputs, in general, are generated by at least one partial product generator (not shown) using the Booth encoding scheme outputs. In FIG. 2, the multiplier has been organized into essentially symmetrical left and right arrays 210 and 220, respectively, and a merge block (MG) 230. The left array 210 has 16 CSAs and the right array 220 has 15 CSAs. Within each of the left and right arrays 210 and 220, respectively, the CSAs are further organized into a first sub-group L1 and R1, respectively, and a second sub-group L2 and R2, respectively, which are all independent from each other. As a result of this independent design architecture, the multiplier has the capability to turn off the portions of the multiplier that are not in use, such as, for example, the left array 210 during a 32-bit operation, which will provide a power savings of about 50%. Similarly, switching off the right array 220 will also provide a power savings of about 50%, even though the right array 220 only has 15 CSAs versus the 16 CSAs in the left array 210. This is extremely efficient for architectures like the 64-bit Intel® Architecture (IA-64processors, which uses a Single Instruction, Multiple Data (SIMD) technique. The SIMD technique can use "0's" as their operands, thus allowing unused parts of the multiplier to be turned off, which can reduce the power required to operate the multiplier by approximately 50%. IA-64 processors are manufactured by the Intel Corporation of Santa Clara, Calif. SIMD, which lets one microinstruction operate at the same time on multiple data items, was introduced in the MMX™ line of Pentium® processors from Intel®.

The eleven CSAs are distributed on the first level between the first sub-groups L1 and R1 212 and 222, respectively, and the second sub-groups L2 and R2 214 and 224, respectively, so that 3 CSAs are in the first sub-groups L1 212 (CSAs 8, 9 and 10) and R1 222 (CSAs 5, 6 and 7) of each array and the second sub-group L2 214 (CSAs 2, 3 and 4) of the left array. The remaining 2 CSAs are located on the first level in the second sub-group R2 224 (CSAs 0 and 1) of the right array, which has 2 external inputs, A and C, in place of the third CSA of the other three subgroups. The inputs A and C are not required for the proper operation of the multiplier and, as such, when actual values for one or both of the inputs A and C are not received, a default value of "0" is used. A second level, which is coupled to the first level, contains 8 CSAs and each sub-group L1 212 (CSAs 17 and 18), L2 214 (CSAs 15 and 16), R1 222 (CSAs 13 and 14) and R2 224 (CSAs 11 and 12) has 2 CSAs. In sub-groups L1 212, L2 214 and R1 222, since the second level CSAs are similarly coupled to the first level CSAs, only the coupling in the first sub-group L1 212 of the left array will be described. In the first sub-group L1 212 of the left array, CSA 17 is coupled to and receives both partial products from CSA 8 and CSA 17 is also coupled to and receives only the right partial product from CSA 9. CSA 18 is coupled to and receives both partial products from CSA 10 and CSA 18 is also coupled to and receives only the left partial product from CSA 9. In sub-group R2 224, CSA 11 is coupled to and receives both partial products from CSA 0 and CSA 11 is also coupled to and receives only the right partial product from CSA 1. CSA 12 is coupled to and receives only the right partial product from CSA 1 and CSA 12 is also coupled to and receives both external inputs A and C.

A third level, which is coupled to the second level, contains 4 CSAs and each sub-group L1 212 (CSA 22), L2 214 (CSA 21), R1 222 (CSA 20) and R2 224 (CSA 19) has 1 CSA. At this level, sub-groups L1 212 and R1 222 are symmetrical and, in sub-group L1 212, CSA 22 is coupled to and receives both partial product outputs from CSA 18 and CSA 22 is also coupled to and receives the left partial product from CSA 17. Similarly, in sub-group R1 222, CSA 20 is coupled to and receives both partial product outputs from CSA 14 and CSA 20 is also coupled to and receives the left partial product from CSA 13. Sub-groups L2 214 and R2 224 are likewise symmetrical and, in sub-group L2 214, CSA 21 is coupled to and receives both partial product outputs from CSA 15 and CSA 21 is also coupled to and receives the right partial product from CSA 16. Similarly, in sub-group R2 224, CSA 19 is coupled to and receives both partial product outputs from CSA 11 and CSA 19 is also coupled to and receives the right partial product from CSA 12.

A fourth level, which is coupled to the third level, contains 4 CSAs and each sub-group L1 212 (CSA 26), L2 214 (CSA 25), R1 222 (CSA 24) and R2 224 (CSA 23) has 1 CSA. At this level, sub-groups L1 212 and R1 222 are again symmetrical and, in sub-group L1 211, CSA 26 is coupled to and receives both partial product outputs from CSA 22 and CSA 26 is also coupled to and receives the right partial product from CSA 17. Similarly, in sub-group R1 222, CSA 24 is coupled to and receives both partial product outputs from CSA 20 and CSA 24 is also coupled to and receives the right partial product from CSA 13. Sub-groups L2 214 and R2 224 are likewise symmetrical and, in sub-group L2 214, CSA 25 is coupled to and receives both partial product outputs from CSA 21 and CSA 25 is also coupled to and receives the left partial product from CSA 16. Similarly, in sub-group R2 224, CSA 23 is coupled to and receives both partial product outputs from CSA 19 and CSA 23 is also coupled to and receives the left partial product from CSA 12.

The first and second sub-groups L1 212 and L2 214, respectively, of the left array 210 are coupled to the left array merge block 216 and the first and second sub-groups R1 222 and R2 224, respectively, of the right array 220 are coupled to the right array merge block 226. A fifth level in the multiplier, which is coupled to the fourth level in the sub-groups 212, 214, 222 and 224 and contains 2 CSAs, with the left array merge block 216 and the right array merge block 226 each having 1 CSA. In the left array merge block 216, CSA 28 is coupled to and receives both partial products from CSA 26 in the first sub-group 212 and CSA 28 is also coupled to and receives the left partial product from CSA 25 of the left array 210. Similarly, in the right array merge block 226, CSA 27 is coupled to and receives both partial products from CSA 24 in the first sub-group 222 and CSA 27 is also coupled to and receives the left partial product from CSA 23 of the right array 220. A sixth level in the multiplier is coupled to the fifth level in the left and right merge blocks 216 and 226 and contains 2 CSAs, with the left array merge block 216 and the right array merge block 226 each having 1 CSA. In the left array merge block 216, CSA 30 is coupled to and receives both partial products from CSA 28 and CSA 30 is also coupled to and receives the right partial product from CSA 25 of the left array 210. Similarly, in the right array merge block 226, CSA 29 is coupled to and receives both partial products from CSA 27 and CSA 29 is also coupled to and receives the right partial product from CSA 23 of the right array 220.

A seventh level, which includes CSA 31 is located in the merge block 230 and is coupled to and receives both partial products from CSA 30 in the left array merge block 216 and CSA 31 is also coupled to and receives the left partial product from CSA 29 in the right array merge block 226. An eighth level, which includes CSA 32 is located in the merge block 230 and is coupled to and receives both partial products from CSA 31 and CSA 32 is also coupled to and receives the right partial product from CSA 29 in the right array merge block 226. CSA 32 then outputs the final partial products, Op 1 and Op 2, which are the final carry partial product and the final sum partial product.

In FIG. 2, the symmetrical Wallace tree structure has a maximum critical path of 8 CSAs and provides the separation of the CSA groupings that permits the selective switching-off of not only the left and right arrays 210 and 220, respectively, but also the sub-groupings 212, 214, 222 and 224. This structure also provides for late arriving inputs A and C, in the second sub-group (R2) 224 of the right array 220, to arrive at the second-level CSAs. In general, inputs A and C, which are unrelated to the original Booth-encoded input partial products, are provided for additional late arriving inputs, such as, for example, a value or values from another portion or portions of the chip that needs to be added to the operation currently in the multiplier. Input C may also be an aligned value, z, such as, for example, the value for z needed to perform the operation $x*y+z$, where z is to be added to the product $x*y$ in a similar operation as described in relation to FIG. 1 for the adder output 110.

In FIG. 2, the left array 210 and the right array 220 are very symmetrical, which results in a good layout scheme. In general, sub-groups L1 and R1 are identical to each other and almost identical to sub-group L2. Similarly, left merge block (LM) 216 and right merge block (RM) 226 are identical to each other. This symmetry likewise contributes to a regular and more efficient layout. As a result of the more efficient layout, the multiplier can be implemented within a smaller area on the chip.

In an alternate embodiment in accordance with the present invention, the CSAs can be implemented using higher voltage circuits, such as, for example, a Domino circuit and/or a static circuit. Although, for example, embodiments using the Domino circuit, generally, may not result in the same power savings, area savings and heat reduction as the CPL circuit implementation, the Domino circuit implementation will still result in power savings due to the ability of the multiplier to selectively turn off those sections that are not needed for a particular calculation.

Figure 3A:
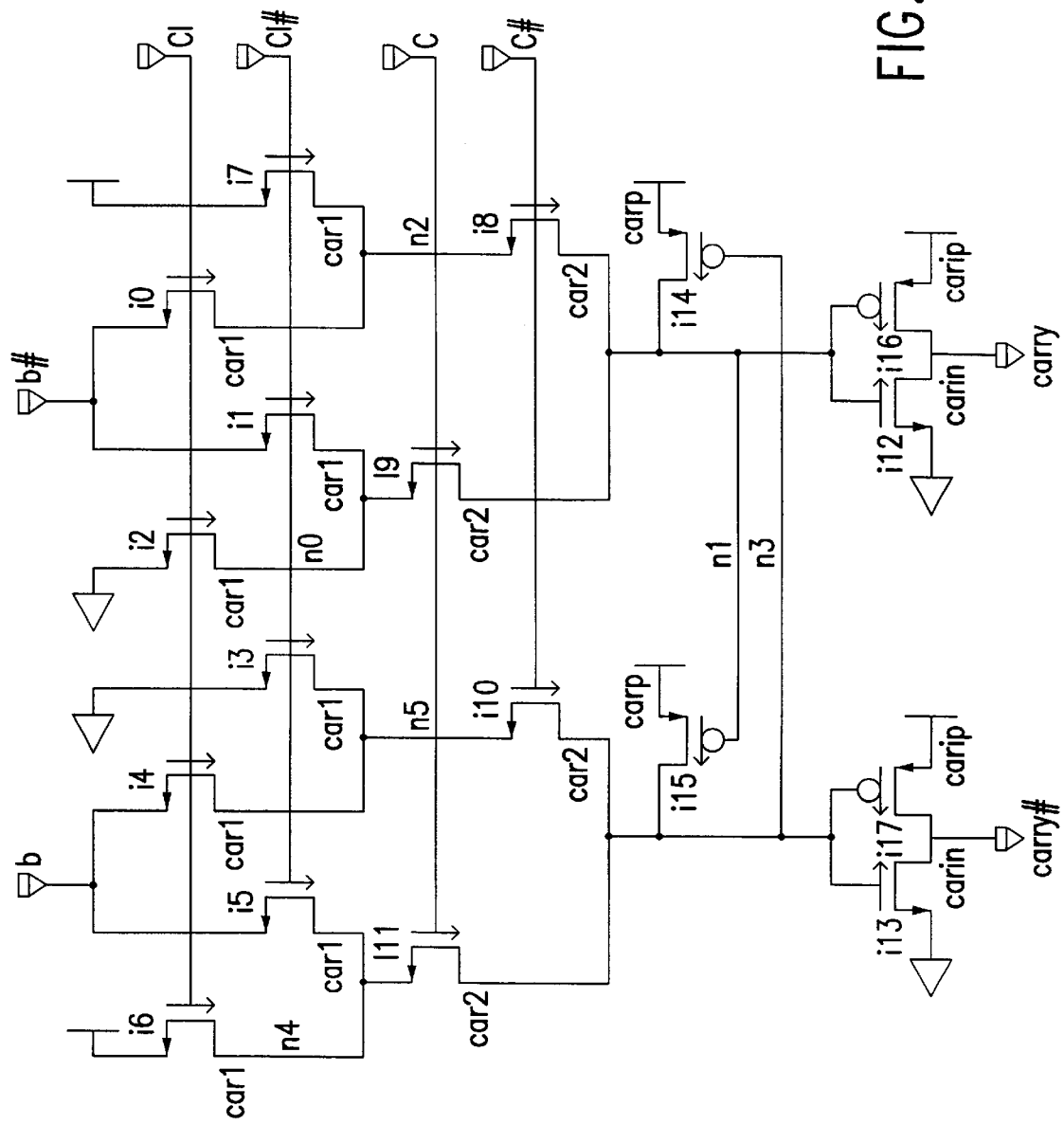
FIG. 3A is a circuit schematic diagram illustrating a Complementary Pass-transistor Logic (CPL) implementation of the carry block of the carry save adder (CSA) cell in accordance with an embodiment of the present invention.
Figure 3B:
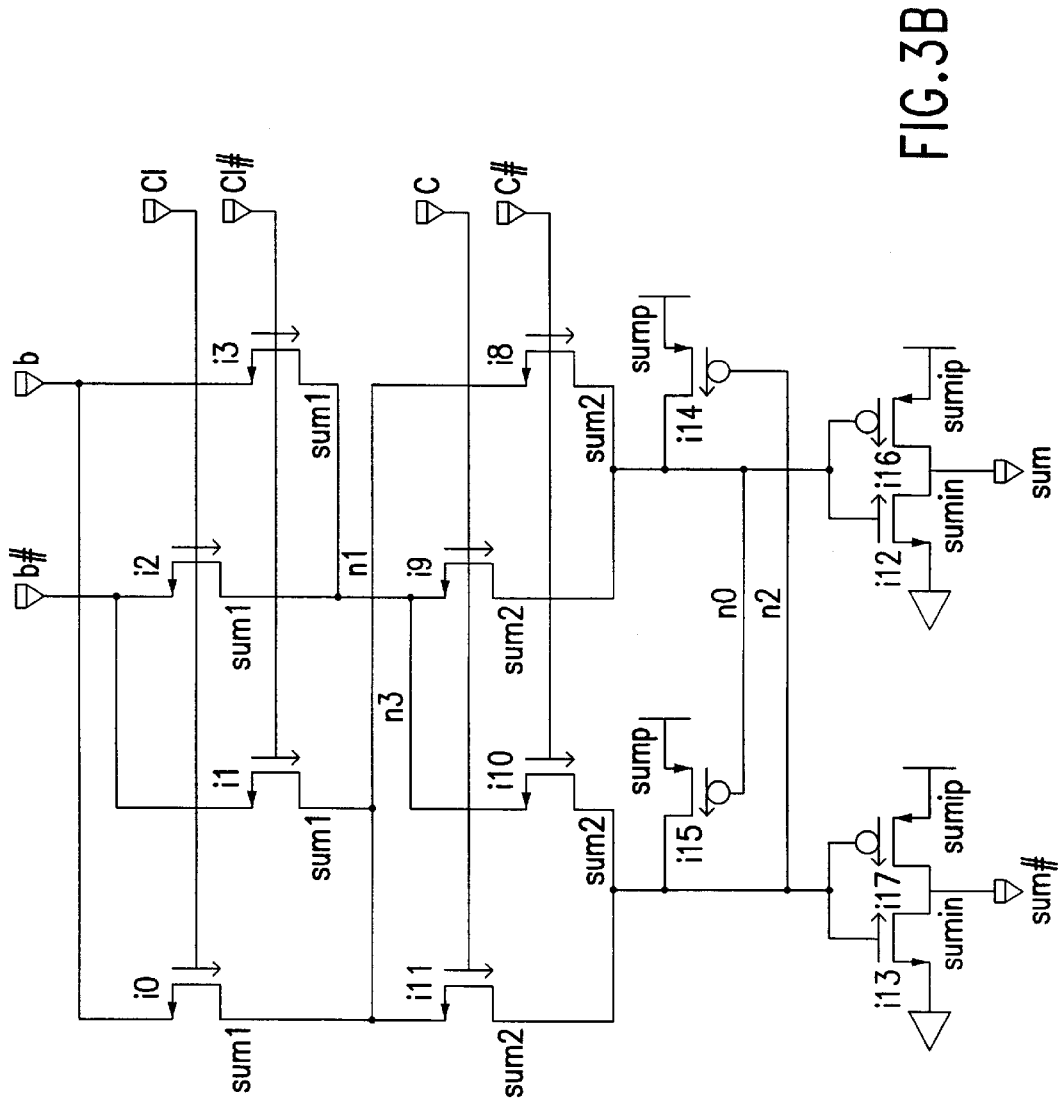
FIG. 3B is a circuit schematic diagram illustrating CPL implementation of the sum block of the CSA cell in accordance with an embodiment of the present invention.

FIGS. 3A and 3B are circuit schematic diagrams illustrating the CPL implementation of the carry and sum blocks, respectively, of the CSA cell in accordance with an embodiment of the present invention. In FIGS. 3A and 3B, in the CPL CSA, all of the N-type pass gates, that is, those gates labeled, 'car1', 'car2', 'sum1', 'sum2', can be implemented as low Vt devices while using high Vt devices, that is, those gates labeled, 'carp', 'carin', 'carip', 'sump', 'sumin' and 'sumip', in the inverters at the output stage of each cell to improve the drive strength of the CSA. As a result, because the low Vt devices are smaller than the standard Domino devices, the area needed to implement the CSA of FIG. 2 can be minimized. For example, in an embodiment of the present invention, the area of the entire multiplier can be made approximately 10% smaller using CPL CSAs than a comparable Domino CSA implementation, based on a device size count alone. In FIGS. 3A and 3B, the partial product inputs are received on input lines a, b and c and a complementary partial product input for each of input lines a, b and c are received on input lines a#, b# and c#, respectively. The result of the add operation in the CSA is output as a carry value on lines 'carry' and 'carry#' in FIG. 3A and as a sum value on lines 'sum' and 'sum#' in FIG. 3B.

In FIGS. 3A and 3B, elimination of the clock signal has contributed to the reduced power requirement and eliminated the clock skew requirement, which reduces the load on the main clock grid and saves a significant amount of power. In addition, CPL based circuits scale well and, therefore, can be used in shrinks/compactions on future processes with minimal complications. In fact, in accordance with an embodiment of the present invention, a 64-bit multiplier with a radix-8 modified Booth encoding scheme, is contemplated, that generates 22 partial products and has 7 CSAs in the critical path of the modified, symmetrical Wallace tree structure, which provides a shorter latency than both the Domino circuit-based multiplier in FIG. 1 and the CPL circuit-based multiplier of FIG. 2.

The lower power multiplier design in FIG. 2 alleviates the thermal gradient problem (creation of hot spots) generally found in Domino circuit multipliers. Multipliers, in general, are very dense structures with a lot of activity in their circuits (high toggling), which leads to a large amount of power being dissipated in a small area leading to hot spots. In contrast, CPL circuits have lower activity factors than the equivalent domino circuit and, therefore, bum less power and have less problems due to hot spots. Likewise, CPL circuits, when used in conjunction with pulsed latches, help eliminate glitches from propagating down into the following stages.

Figure 4:
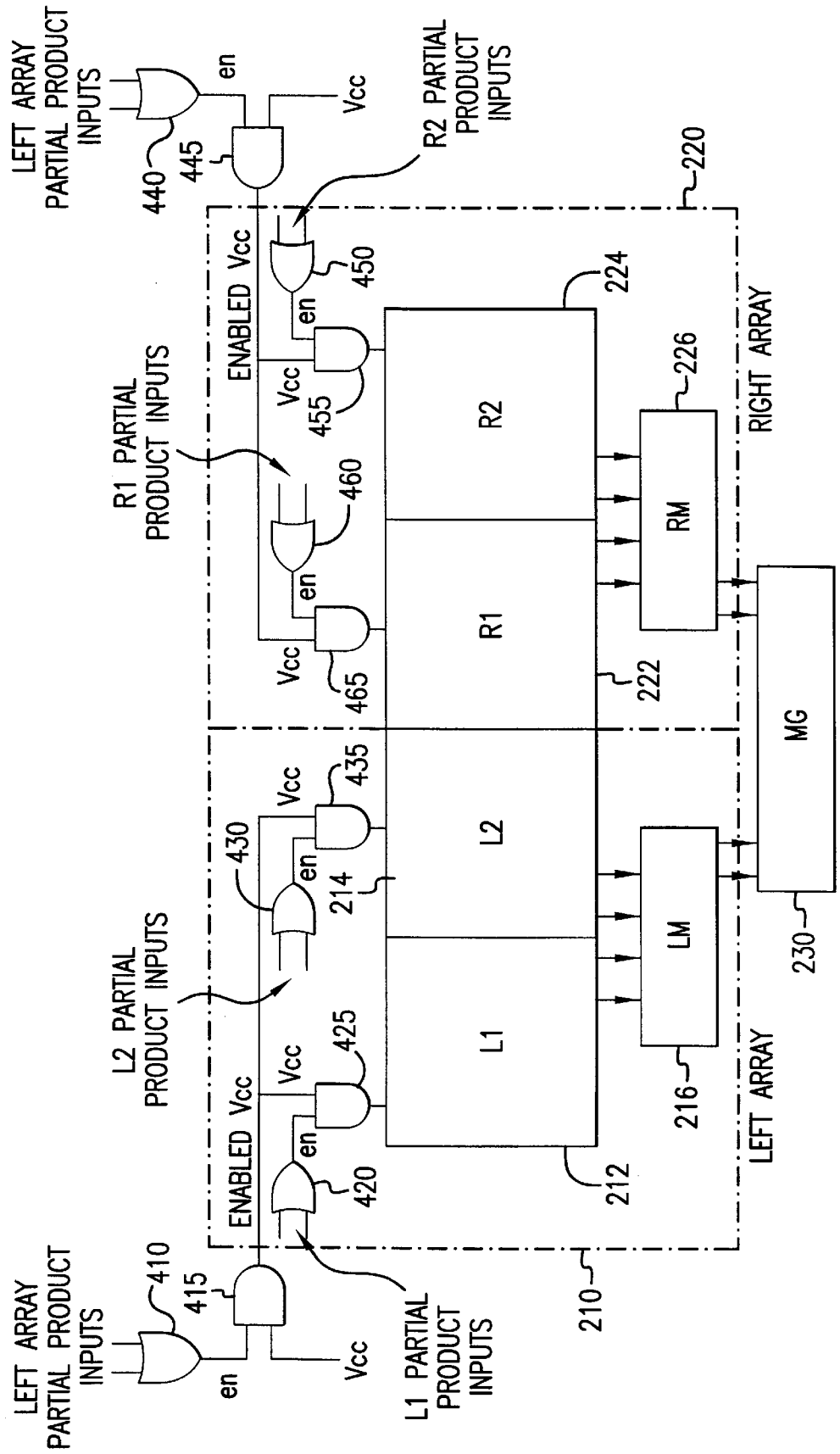
FIG. 4 is a top level logic block diagram of the modified Wallace tree structure of FIG. 2, which illustrates the parts of the multiplier that can be turned off and a logic circuit to turn the parts on and off, in accordance with an embodiment of the present invention.

FIG. 4 is a top level logic block diagram of the modified Wallace tree structure of FIG. 2, which illustrates the parts of the multiplier that can be turned on and off and a logic circuit to turn the parts on and off, in accordance with an embodiment of the present invention. In FIG. 4, in accordance with an embodiment of the present invention, left array 210, right array 220, first sub-group L1 212, second sub-group L2 214, first sub-group R1 222 and second sub-group R2 224 are the parts of the multiplier that can be turned on and off. In this embodiment of the present invention, the left array 210 and the right array 220 each receive power independent of the other array and, thus, can be separately turned on and off without affecting the other array. Similarly, first and second sub-groups L1 and L2 each receive power independent of each other and, thus, can be separately turned on and off without affecting the other sub-group. Similarly, first and second sub-groups R1 and R2 each receive power independent of each other and, likewise, can also be separately turned on and off without affecting the other sub-group.

In FIG. 4, an OR gate 410 receives all of the left array 210 partial product inputs and outputs an enable signal (en) if at least one of the partial product inputs contains a non-zero input. In this embodiment of the present invention, the partial product inputs include the highest 18 partial products, specifically, those partial products that are provided to CSAs 5–10. An AND gate 415 is coupled to the OR gate 410 and also to a power line (Vcc) such that, if both en and Vcc are on, the AND gate 415 will output an enabled Vcc signal to power the left array 210. If only en or Vcc or neither are on then no power will be supplied to the left array 210. If the enabled Vcc line is powered, then an OR gate 420 receives all of the first sub-group L1 212 partial product inputs and outputs an en signal if at least one of the partial product inputs contains a non-zero input. An AND gate 425 is coupled to the OR gate 420 to receive the en signal and also to the Vcc input line such that, if both en and Vcc are on, the AND gate 425 will output an enabled Vcc signal to power the first sub-group L1 212. If only en or Vcc are on then no power will be supplied to the first sub-group L1 212. Similarly, if the enabled Vcc line is powered, then an OR gate 430 receives all of the second sub-group L1 214 partial product inputs and outputs an en signal if at least one of the partial product inputs contains a non-zero input. An AND gate 435 is coupled to the OR gate 430 to receive the en signal and also to the Vcc input line such that, if both en and Vcc are on, the AND gate 435 will output an enabled Vcc signal (not labeled for reasons of clarity) to power the second sub-group L1 214. If only en or Vcc or neither are on then no power will be supplied to the second sub-group L2 214.

The logic circuits for e right array 220 operate in a manner similar to that described above for the left array 210, except the logic circuits for the right array use the lowest 15 partial products, specifically, those partial products that are provided to CSAs 0–4.

In accordance with an embodiment of the present invention, a multiplier, includes a left and right array, each with multiple carry save adders (CSAs) and a merge block coupled to the left array and the right array, the merge block including multiple CSAs, the merge block being configured to output two final partial products.

In accordance with an embodiment of the present invention, a multiplier, includes a left array configured to receive a first group of inputs and to output two left array partial products, a right array configured to receive a second group of inputs and to output two right array partial products and a merge block coupled to the left array and the right array, where the merge block is configured to receive the left array partial products and the right array partial products and to output two final partial products.

In accordance with an embodiment the present invention, a computer system, including a processor, which includes at least one multiplier, which includes a left array with multiple carry save adders (CSAs), a right array with multiple CSAs and a merge block coupled to the left array and the right array. The merge block also has multiple CSAs and the merge block is configured to output two final partial products.

It should, of course, be understood that while the present invention has been described mainly in terms of low power multipliers and microprocessor-based personal computer systems, those skilled in the art will recognize that the principles of the invention may be used advantageously with alternative embodiments involving other integrated processor chips and computer systems. Accordingly, all such implementations which fall within the spirit and the broad scope of the appended claims will be embraced by the principles of the present invention.

What is claimed is:

1. A multiplier, comprising:
   a left array, including a first plurality of carry save adders (CSAs);
   a right array, including a second plurality of CSAs; and
   a merge block coupled to the left array and the right array, the merge block including a third plurality of CSAs, the merge block being configured to output two final partial products;
   said CSAs being configured in a symmetrical Wallace tree structure, the left array and the right array to each receive power independently.

2. The multiplier of claim 1, wherein each of the CSAs in the first, second and third plurality of CSAs comprises:
   a complementary pass-transistor logic (CPL) CSA.

3. The multiplier of claim 1, wherein each of the CSAs in the first, second and third plurality of CSAs comprises:
   a 3:2 CSA.

4. The multiplier of claim 1, each of the left and right arrays, comprises:
   a first sub-group;
   a second sub-group; and
   an array merge block coupled to the first sub-group and the second sub-group, the array merge block to output two intermediate partial products.

5. The multiplier of claim 4, wherein the first sub-group and the second sub-group independently receive power.

6. The multiplier of claim 5, wherein the power to each sub-group can be separately turned on and off.

7. The multiplier of claim 4, wherein the two intermediate partial products comprise:
   an intermediate sum value; and
   an intermediate carry value.

8. The multiplier of claim 4, wherein the array merge block of the left array and the array merge block of the right array are each coupled to the merge block and the merge block further to receive the left array two partial products and the right array two partial products.

9. The multiplier of claim 1, each of the left array and the right array, comprising:
   a first sub-group, including a first plurality of the respective plurality of CSAs in each of the left and right arrays;

a second sub-group, including a second plurality of the respective plurality of CSAs in each of the left and right arrays; and an array merge block coupled to the first sub-group and the second sub-group, the array merge block including a third plurality of the respective plurality of CSAs in each of the left and right arrays.

10. The multiplier of claim 9, each of the first sub-group and the second sub-group of the left array and the first sub-group of the right array, comprising:

a first level, including a first, a second and a third CSA;

a second level, including a fourth CSA and a fifth CSA, the fourth CSA coupled to the first and second CSA and the fifth CSA coupled to the second and third CSA;

a third level, including a sixth CSA, the sixth CSA coupled to the fourth and fifth CSA; and a fourth level, including a seventh CSA, the seventh CSA coupled to the sixth and fourth CSA.

11. The multiplier of claim 9, he second sub-group of the right array, comprising:

a first level, including a first and a second CSA;

a second level, including a third CSA and a fourth CSA, the third CSA coupled to the first CSA and to two external inputs and the fourth CSA coupled to the first and second CSAs;

a third level, including a fifth CSA, the fifth CSA coupled to the third and fourth CSAs; and a fourth level, including a sixth CSA, the sixth CSA coupled to the third and fifth CSAs.

12. The multiplier of claim 9, the array merge block, comprising:

a first CSA coupled to the first sub-group and the second sub-group; and a second CSA coupled to the first CSA and the second sub-group.

13. The multiplier of claim 9, the merge block, comprising:

a first CSA coupled to the array merge block of the left array and the array merge block of the right array; and a second CSA coupled to the first CSA and the array merge block of the right array.

14. A multiplier, comprising:

a left array, to receive a first group of inputs and to output two left array partial products;

a right array, to receive a second group of inputs and to output two right array partial products; and a merge block coupled to the left array and the right array, the merge block to receive the left array partial products and the right array partial products and to output two final partial products;

the left array and the right array to each receive power independently and the power to each array to be separately turned on and off.

15. The multiplier of claim 14, wherein the first group of inputs comprise a plurality of partial products.

16. The multiplier of claim 14, wherein the second group of inputs are selected from the group comprising:

a plurality of partial products;

an aligned value; and at least one late arriving input.

17. The multiplier of claim 14, the multiplier being configured in a symmetrical Wallace tree structure.

18. The multiplier of claim 17, each of the left and right arrays, comprising:

a first sub-group;

a second sub-group; and an array merge block coupled to the first sub-group and the second subgroup, the array merge block configured to receive two first sub-group partial products and to receive two second sub-group partial products;

wherein the first sub-group and the second sub-group are each configured to operate independently of each other.

19. The multiplier of claim 18, wherein the first and second sub-groups each independently receive power and the power to each sub-group can be separately turned on and off.

20. The multiplier of claim 18, wherein the array merge block is coupled to the merge block and the array merge block is further to output an array partial product carry value and an array partial product sum value.

21. The multiplier of claim 20, each of the first left sub-group, the second left sub-group and the first right sub-group comprising:

a first level, including a first, a second and a third CSA each to receive three partial products and output two partial products;

a second level coupled to the first level, including a fourth and a fifth CSA, the fourth CSA to receive the two partial products output from the first CSA and one of the partial products output from the second CSA and to output two partial products, the fifth CSA to receive the other partial product output from the second CSA and the two partial products output from the third CSA and to output two partial products;

a third level coupled to the second level, including a sixth CSA, the sixth CSA to receive the two partial products output from the fourth CSA and one of the partial products output from the fifth CSA and to output two partial products; and a fourth level coupled to the second level and the third level, including a seventh CSA, the seventh CSA to receive the two partial products output from the sixth CSA and the other one of the partial products output from the fifth CSA and to output two partial products.

22. The multiplier of claim 20, the second sub-group of the right array, comprising:

a first level, including a first and a second CSA;

a second level, including a third CSA and a fourth CSA, the third CSA coupled to the first CSA and to two external inputs and the fourth CSA coupled to the first and second CSAs;

a third level, including a fifth CSA, the fifth CSA coupled to the third and fourth CSAs; and a fourth level, including a sixth CSA, the sixth CSA coupled to the third and fifth CSAs.

23. The multiplier of claim 14, the left and right arrays each comprising:

a plurality of complementary pass-transistor logic (CPL) 3:2 carry-save-adders (CSAs) configured in a symmetrical Wallace tree structure.

24. A computer system, comprising:

a processor, the processor comprising at least one multiplier, the at least one multiplier including a left array having a first plurality of carry save adders (CSAs), a right array having a second plurality of CSAs and a merge block coupled to the left array and the right array, the merge block having a third plurality of CSAs, the merge block to output two final partial products;

the left array and the right array to each independently receive power and the power to each array to be separately turned on and off.

25. The computer system of claim 24, wherein each of the CSAs comprises:

a complementary pass-transistor logic (CPL) CSA.

26. The computer system of claim 24, wherein each of the CSAs comprises:

a 3:2 CSA.

27. The computer system of claim 24, each of the left and right arrays, comprising:

a first sub-group;

a second sub-group; and an array merge block coupled to the first sub-group and the second sub-group, the array merge block to output two intermediate partial products.

* * * * *